(12) United States Patent
Pfirsch

(10) Patent No.: US 7,145,201 B2
(45) Date of Patent: Dec. 5, 2006

(54) SEMICONDUCTOR COMPONENT

(75) Inventor: Frank Pfirsch, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/027,293

(22) Filed: Dec. 30, 2004

(65) Prior Publication Data

US 2005/0194635 A1  Sep. 8, 2005

(30) Foreign Application Priority Data

Dec. 30, 2003  (DE) .................. 103 61 714

(51) Int. Cl.
*H01L 21/32* (2006.01)
(52) U.S. Cl. ................. 257/330; 257/E27.052
(58) Field of Classification Search ........... None
See application file for complete search history.

(56) References Cited

U.S. PATENT DOCUMENTS

| | | | |
|---|---|---|---|
| 3,700,934 A * | 10/1972 | Swain ............... | 327/513 |
| 5,319,515 A | 6/1994 | Pryor et al. | |
| 5,465,188 A | 11/1995 | Pryor et al. | |
| 5,603,324 A * | 2/1997 | Oppelt et al. ........ | 600/437 |
| 5,625,519 A | 4/1997 | Atkins | |
| 5,847,436 A * | 12/1998 | Iwata ................. | 257/467 |
| 5,862,803 A * | 1/1999 | Besson et al. ........ | 600/508 |
| 5,960,277 A | 9/1999 | Blanchard | |
| 6,067,239 A | 5/2000 | Ueki | |
| 6,118,641 A | 9/2000 | Atkins et al. | |
| 6,233,532 B1 * | 5/2001 | Boudreau et al. ..... | 702/89 |
| 6,310,350 B1 * | 10/2001 | Silver et al. ........ | 250/370.06 |
| 6,313,706 B1 * | 11/2001 | Kakuta et al. ....... | 330/302 |
| 6,383,892 B1 * | 5/2002 | Colt, Jr. ............. | 438/457 |
| 6,404,608 B1 | 6/2002 | Pryor et al. | |
| 2004/0173844 A1 * | 9/2004 | Williams et al. ..... | 257/329 |

FOREIGN PATENT DOCUMENTS

| | | |
|---|---|---|
| DE | 41 32 141 A1 | 4/1993 |
| DE | 691 23 598 T2 | 6/1997 |
| DE | 197 56 640 A1 | 4/1999 |
| DE | 198 49 018 A1 | 4/1999 |
| DE | 199 60 563 A1 | 6/2001 |
| DE | 100 25 440 A1 | 12/2001 |
| JP | 2003133925 A | 5/2003 |

\* cited by examiner

*Primary Examiner*—Evan Pert
*Assistant Examiner*—Benjamin P. Sandvik
(74) *Attorney, Agent, or Firm*—Maginot, Moore & Beck

(57) ABSTRACT

A semiconductor component (10) is proposed in which a control resistance element (NTC) is provided in electrical contact between a control region (G) for setting operating properties and a first input/output region (S), the control resistance element (NTC) having an operating temperature range in which the nonreactive resistance falls monotonically as the operating temperature increases.

32 Claims, 6 Drawing Sheets

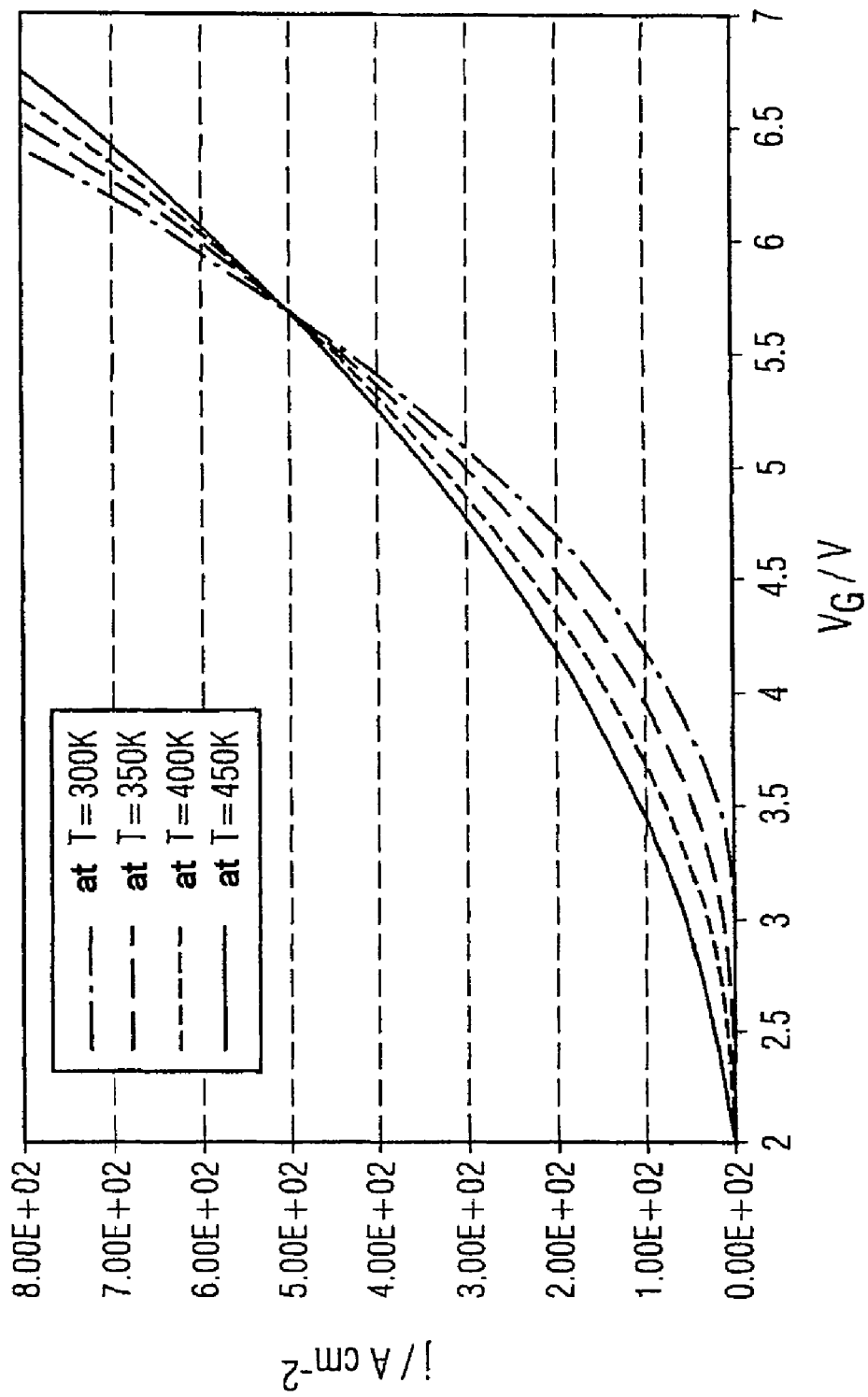

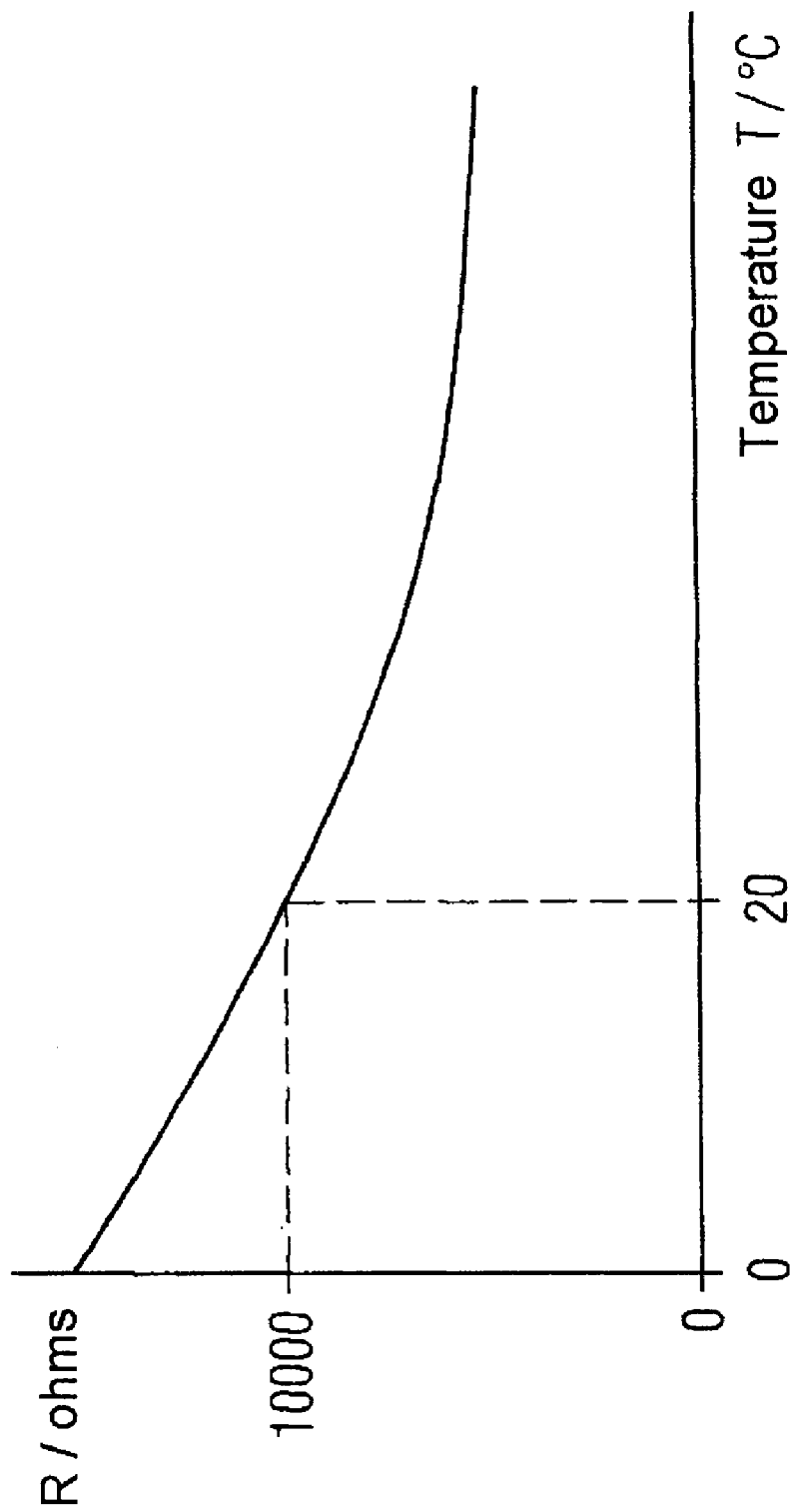

SEMICONDUCTOR COMPONENT

FIELD OF THE INVENTION

The present invention relates to a semiconductor component and to an integrated semiconductor device having local overtemperature protection.

BACKGROUND

In many semiconductor components or integrated semiconductor devices formed therefrom, a reduction of the mobility of the charge carriers involved occurs as the operating temperature of the material regions respectively involved increases. This has the effect that the gradient in the transfer characteristic of the semiconductor component respectively considered decreases as the temperature increases. The phenomenon wherein the threshold voltage of the semiconductor component considered also decreases as the temperature increases often occurs at the same time. This has the effect, in the case of MOS transistors, by way of example, that an unstable range and a stable range form with regard to the temperature development. At gate voltages below a specific point of intersection (temperature-stable point) in the family of characteristic curves, the current to be transported and thus the thermal power to be taken up increase as the temperature increases. This may lead to an unstable behavior of the semiconductor component. On the other hand, at gate voltages above the temperature-stable point, the current decreases as the temperature increases. When viewed overall, it is possible—not only in the case of MOS transistors—for thermal overloads to form which change or restrict the operating parameters and the operation of a semiconductor component as such or even lead to the destruction of the semiconductor component.

SUMMARY

It is an object of the present invention to provide a semiconductor component in which a local temperature protection or local thermal overload protection can be formed in a particularly simple yet nevertheless reliable manner.

In the case of a semiconductor component of the type mentioned in the introduction, the object is achieved according to embodiments of the invention. The object is furthermore achieved in the case of an integrated semiconductor device with the characterizing features of embodiments of the invention.

The semiconductor component according to the invention is characterized by the fact that provision is made of a control resistance element in electrical contact with the control region and with the first input/output region, and that the control resistance element has an operating temperature range in which the nonreactive resistance of the control resistance element falls monotonically or strictly monotonically as the operating temperature of the control resistance element increases.

Consequently, a central idea of the present invention is to form a control resistor or a control resistance element between the control region and the first input/output region of the semiconductor component. This has the effect of modulating the potential difference between the control region and the first input/output region in the manner of a voltage divider, this modulation being effected on account of the temperature dependence of the control resistance element. This means that during operation at comparatively low or normal operating temperatures, a normal nonreactive resistance or high nonreactive resistance is impressed through the control resistance element provided, so that the full potential difference for the control signal drops between the control region and the first input/output region. By contrast, if the operating temperature and hence the local temperature of the control resistance element are raised, then the control resistance element, on account of this temperature raise, passes into an operating range in which the monotonically falling or strictly monotonically falling temperature characteristic of the nonreactive resistance value of the control resistance element acts so that the potential of the control region is pulled more and more to the potential of the first input/output region as the temperature rises. This ultimately means that, as the temperature rises, the first input/output region and the control region are short-circuited to an increased extent. In the example of a transistor this means that, as the potential difference drops between the first input/output region and the control region, the current that is to be controlled and transferred also decreases and, consequently, the thermal loading is regulated virtually with feedback by means of the electrical power consumption in such a way that a thermal overload can be avoided.

In the case of the semiconductor component according to the invention, it is preferably provided that the control resistance element is arranged and/or formed in such a way that approximately the temperature, operating temperature or the thermal state of the control region, of the first input/output region and/or second input/output region can be sensed through the control resistance element.

As an alternative or in addition, it is provided that the control resistance element is arranged and/or formed approximately in direct proximity to and/or in intimate mechanical and/or thermal contact with the control region, the first input/output region and/or second input/output region.

In a preferred embodiment of the semiconductor component, it is provided that the control resistance element is formed as an NTC thermistor (NTC=negative temperature coefficient) having a first terminal region or terminal and having a second terminal region or terminal. Furthermore, it is provided in this case that the first terminal region or terminal of the control resistance element is in electrical contact with the first input/output region of the semiconductor component and that the second terminal region or terminal of the control resistance element is in electrical contact with the control region of the semiconductor component.

A particularly compact and reliable design results if the control resistance element is formed in a manner integrated in the semiconductor component.

In accordance with the diverse possibilities for application of the present invention, provision is made of various assignments of the first input/output region, the second input/output region and also the control region with regard to the structure regions or terminals of the various component types.

In a particularly preferred embodiment, the first input/output region is provided and/or formed as source region or as source.

In another advantageous development, the first input/output region is provided and/or formed as emitter region or as emitter.

In accordance with a further alternative or additional refinement of the semiconductor component according to the invention, the second input/output region is provided and/or formed as drain region or as drain.

As an alternative or in addition, the second input/output region is provided and/or formed as collector region or as collector.

In a further alternative of the present invention, it is provided that the control region is provided and/or formed as base region or as base.

As an alternative or in addition, the control region is provided and/or formed as gate region or as gate.

It may be provided, correspondingly, that the semiconductor component is formed as a gate controlled semiconductor component.

It is preferred in this case for the semiconductor component according to the present invention to be formed as a component from the group formed by the components MOSFET, IGBT, EST, GTO, MCT.

A semiconductor component according to the present invention which is formed in monolithic integrated fashion is particularly preferred.

In another advantageous refinement of the semiconductor component it is provided that the control region has a control region series resistor. In the case where the control region is formed by a gate region, the control region series resistor is a gate series resistor. In any event, a corresponding control signal can be fed via the control region/gate region, mediated through the control region series resistor or gate series resistor.

In this case, it is provided, in particular, that the control region series resistor or gate series resistor is formed from polysilicon or has polysilicon.

In a particularly preferred embodiment of the semiconductor component according to the invention, it is provided that the control region series resistor or gate series resistor is arranged and/or formed in a trench structure, a trench or a plurality of said structures.

In a particularly preferred embodiment, it is advantageously provided that the semiconductor component is formed as a trench structure component or a trench component and has at least one trench structure, a trench or a plurality of said structures.

In this case, it is provided, in particular, that the control region, the gate region or the gate are arranged and/or formed in a trench structure, a trench or a plurality of said structures.

In a particularly preferred refinement of the semiconductor component according to the invention, it is provided that the control resistance element has an NTC thermistor or is formed by an NTC thermistor.

Furthermore, it is provided as an alternative or in addition that the control resistance element is provided and/or formed as layer region, layer, as part of a layer or as part of a layer region between the control region, in particular a gate electrode, and the first input/output region, in particular a source metallization or a source terminal.

As an alternative or in addition, it may also be provided that the control resistance element is provided and/or formed as layer region, layer, as part of a layer or as part of a layer region between a gate electrode and a source zone or source region.

In another alternative or another additional refinement of the semiconductor component, the control resistance element has a material or a plurality of materials from the group formed from: germanium, silicon, titanates, dichromates, amorphous semiconductor materials, polycrystalline semiconductor materials.

In another advantageous and particularly preferred embodiment of the semiconductor component according to the invention, it is provided that the control resistance element is formed from a lightly doped semiconductor material, in particular having a doping concentration of less than approximately $10^{14}$ cm$^{-3}$.

In another advantageous refinement of the present invention, it is provided that the control resistance element has, at a temperature of approximately 400 K, a nonreactive resistance that is approximately at least ten times the nonreactive resistance of the control resistance element at a temperature of approximately 500 K.

It is particularly preferred for the control resistance element to have a semiconductor material which has a comparatively large band gap, in particular above approximately 2 eV, and/or which has a doping with an energy level having a distance of at least approximately 0.8 eV from the conduction or valence band edge.

In a preferred embodiment of the semiconductor component, it is provided that a limiting resistor is provided between the control region or gate region and the first input/output region or source region in series.

In this case, it is advantageous if the limiting resistor is provided between the control region or gate region and the control resistance element.

The present invention furthermore provides an integrated semiconductor device, which has at least one semiconductor component according to the present invention.

It is particularly preferred, however, for the integrated semiconductor device according to the invention to have a plurality of semiconductor components according to the invention and for this plurality of semiconductor components to be provided, arranged and/or formed in a manner connected in parallel in a cell array.

In this case, it is provided, in particular, that the cell array is divided or subdivided into a plurality of control regions or gate regions.

Furthermore, it is advantageous in this case that the gate regions or control regions in each case have an individual control region series resistor or a gate series resistor and/or are connected to one another via a common control terminal or gate terminal.

These and further aspects of the present invention are also apparent on the basis of the observations below:

Transfer characteristic curves of a MOS transistor are shown e.g. by the profiles illustrated in FIG. 1. As the temperature increases, both the threshold voltage and the gradient decrease on account of decreasing carrier mobility. Both phenomena together lead to a temperature-stable point at which the characteristic curves intersect one another.

As the temperature increases, the current increases at gate voltages below this point or range and decreases above this point. If power transistors are operated below the temperature-stable point (load dump and linear controller conditions), current splitting may occur on account of the positive feedback, which leads to destruction of the component in the extreme case. A further problem exists in the case of load short circuit, e.g. in the case of IGBTs. The current then rises to very high values when the gate is open and there is a high collector-emitter or drain-source voltage, so that the component can take up the high power generated in the component only for a few microseconds and is then destroyed on account of the excessively high temperature.

The invention specifies, inter alia, a structure which under these conditions protects itself against excessively high heating, to be precise as required also locally at a not necessarily foreseeable location.

A structure is known, by way of example, in which a thyristor is fitted on the MOSFET to be protected. Said thyristor is arranged electrically between gate and source of the MOSFET and turns on when a certain temperature is exceeded, as a result of which gate and source are practically short-circuited and the MOSFET is turned off. A disadvantage of this structure, and also of the following structure, is that an additional component has to be produced and constructed with the MOSFET. Moreover, only a temperature value at a predetermined location or an average temperature value is detected, but the MOSFET is thus turned off altogether, while other locations would not have to be turned off or else are already too hot.

For turning off the MOSFET, it is likewise possible to use a thyristor which, however, does not trigger itself but rather is triggered by the current of a temperature sensor that is monolithically integrated into the MOSFET.

A plurality of temperature sensors may be used in a component and e.g. turned off when one of said sensors exceeds a predetermined temperature. A nonuniform temperature distribution can thereby be taken into consideration.

On the other hand, besides a temperature controlled switch for turning off the MOSFET, it is possible to integrate a second temperature sensor, with the aid of which the gate-source voltage and thus the load current are reduced before the turn-off temperature is actually reached.

It is also possible to use two temperature sensors in order to detect a temperature difference.

Contrary to these measures, NTC thermistors are semiconductor resistors that are temperature-dependent. They conduct better at higher temperatures than at low temperature. They have a greatly negative temperature coefficient TC, which is why they are called NTC thermistors.

NTC thermistors are produced e.g. from iron oxide ($Fe_2O_3$), $ZnTiO_4$ and magnesium dichromate ($MgCr_2O_4$)

The invention consists, inter alia, in the fact (FIGS. 3 and 4) that, in a power transistor comprising a multiplicity of cells, one (FIG. 3) or a plurality (FIG. 4) of cell regions are formed depending on the size of the transistor, the gates of which cell regions in each case form an electrically contiguous electrode and are connected to the common gate terminal via a respective gate series resistor. The common gate terminal, for its part, is possibly connected via further elements, e.g. a further gate resistor, to the gate driving arrangement. A resistor with a negative temperature coefficient (NTC thermistor), with good thermal coupling to the region that heats up, is introduced between each of the gate regions and the source terminal. As long as the temperature of such a region is sufficiently low, the gate voltage is not significantly influenced by the NTC thermistor. However, if the temperature exceeds a certain value, the gate voltage is pulled further and further in the direction of the source potential in the sense of a voltage divider between the NTC thermistor and the gate series resistor. The gate series resistor is expedient in order to protect the NTC thermistor against excessively high overheating by the gate current. The series resistor may be provided in inherent or explicit fashion. It is particularly advantageous to arrange the NTC thermistor as a layer between gate material and source metallization (FIGS. 5 and 6) because a direct thermal coupling then exists.

The advantages of the invention consist in reducing the current in the respective hottest region, with the result that the entire component is heated as uniformly as possible. The thermal coupling is extremely good in the case of the monolithic embodiment; the effect takes place locally where it is necessary. An additional mounting outlay is not required.

A core of the invention is to incorporate, inter alia, as far as possible locally, FIGS. 5 and 6, between gate and source, a material, e.g. an NTC thermistor, which, in the normal temperature range, has a high resistance and thus causes only a small leakage current between gate and source but which, when a certain predetermined temperature is exceeded, has a low resistance and thus reduces the gate voltage, so that the current through the transistor decreases or is even completely turned off.

In the case of a transistor T according to the invention, an NTC thermistor is provided between gate G and source terminal SA and a gate series resistor RG is provided between gate G and gate terminal GA.

Another transistor according to the invention is divided into n regions 1 to n with separate gates Gj. Each region j has an NTC thermistor (NTCj) between gate Gj and the common source terminal SA and a gate series resistor RGj between gate Gj and the common gate terminal GA. The drain terminal DA, like the source terminal SA, is provided and formed jointly for all regions 1 to n.

The following variations are conceivable:
a) MOSFET or IGBT (insulated gate bipolar transistor) or other gate controlled power component (normally off, e.g. EST (emitter switched thyristor), GTO (gate turn off thyristor), MCT (MOS controlled thyristor)) with an NTC thermistor between gate and source,
b) as in a), monolithically integrated,
c) as in a) or b), cell array divided into a plurality of gate regions,
d) as in c), gate regions connected to the common gate terminal via a respective gate series resistor,
e) as in b)–d), NTC thermistor as layer or part of a layer between gate electrode and source metallization (FIG. 5),
f) as in b)–d), NTC thermistor as layer or part of a layer between gate electrode and source zone,
g) NTC thermistor contains germanium, titanates or dichromates,
h) NTC thermistor contains an amorphous semiconductor material,
i) gate series resistor comprises polysilicon,
j) gate and gate series resistor are arranged in one or more trenches,
k) a further resistor is arranged as limiting resistor or buffer resistor in series with the NTC thermistor between gate and source, with the result that the gate is not entirely pulled to source potential by the NTC thermistor. Conversely, the gate can then also be brought to negative voltage by a negative potential at the gate terminal.

BRIEF DESCRIPTION OF THE DRAWINGS

The invention is explained in more detail below with reference to preferred embodiments on the basis of the accompanying drawings.

FIG. 1 is a graphic for elucidating the typical transfer characteristic curves of semiconductor components.

FIG. 2 is an illustration of the temperature dependence of the nonreactive resistance of an NTC thermistor.

Functionally and/or structurally similar or comparable elements and components are designated by the same reference symbols below. A detailed description is not repeated on every occasion they appear.

DETAILED DESCRIPTION

FIG. 1 is a schematic diagram that demonstrates the dependence of the current density j on the gate voltage $V_G$ in the case of a power MOSFET for temperatures of 300 K, 350 K, 400 K and 450 K. The gate voltage $V_G$ in V (volts) is illustrated on the abscissa, whereas the current density j in $A/cm^2$ is recorded on the ordinate. It can clearly be discerned that the transferred current density j has a profile that rises strictly monotonically with the gate voltage $V_G$. The transfer characteristic curves at different temperatures intersect approximately at one point, the so-called temperature-stable point. At gate voltages or current densities below this point, the current density likewise increases when the temperature increases. This leads to a further increase in temperature and, through the positive feedback loop, may cause a—possibly local—rise in the current density and the temperature up to values at which the semiconductor component is destroyed.

FIG. 2 is a schematic illustration of the resistance profile of a so-called NTC thermistor—namely a control resistance element R in the sense of the invention—as a function of the temperature in ° C. The behavior of the nonreactive resistance of the resistance element NTC which falls strictly monotonically as the temperature increases can clearly be discerned.

Figure 3A:
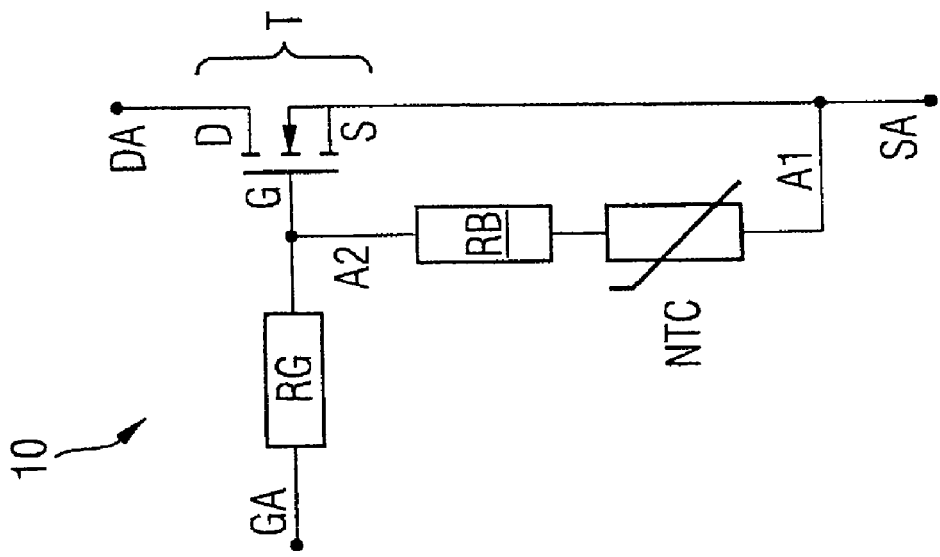
FIGS. 3A, B are circuit diagrams of semiconductor components according to the invention.

FIG. 3A shows the circuitry arrangement on which the semiconductor component 10 is based if a field effect transistor T is configured according to the invention. The field effect transistor T is illustrated as a single transistor or elementary transistor with its source region S, its drain region D and its gate region G, and also the corresponding terminals, namely the source terminal SA, the drain terminal DA and the gate terminal GA. Source S and gate G are electrically connected to one another via an NTC thermistor NTC, namely a control resistance element NTC in the sense of the invention, a first terminal region A1 of the control resistance element NTC being connected to the first input/output terminal S, namely the source of the transistor T, and the second terminal or terminal region A2 of the control resistance element NTC being electrically connected to the gate G or gate region G of the transistor T. The gate G is driven via the gate terminal GA by means of a gate series resistor RG connected in series therewith.

During operation of the arrangement shown in FIG. 3A, the transferred current can be regulated by way of the temperature behavior or the temperature dependence of the control resistance element NTC or of the NTC thermistor with a corresponding characteristic curve as is illustrated in FIG. 2, for example.

Figure 3B:
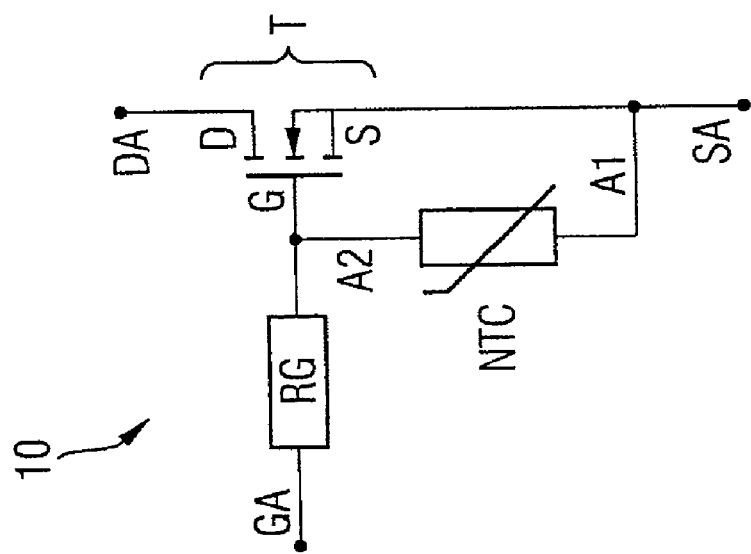

The embodiment of FIG. 3B essentially corresponds to the embodiment from FIG. 3A, but a limiting resistor RB or buffer resistor RB is additionally provided in series with the control resistance element NTC between the first input/output region S or source region S and the control region G or gate region G.

Figure 4:
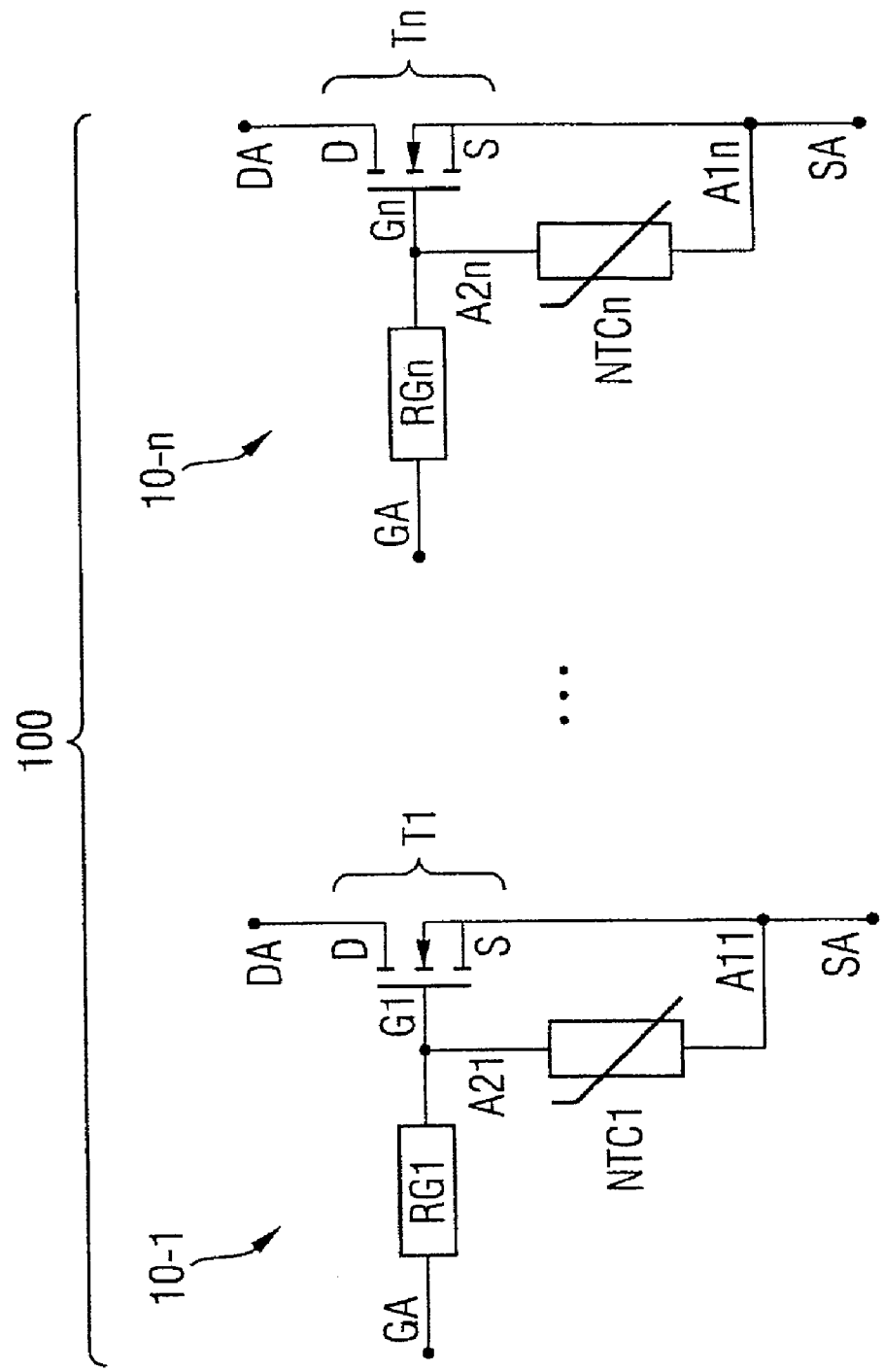
FIG. 4 is an illustration in the form of a circuit diagram for an integrated semiconductor device according to the invention.

In the case of an integrated semiconductor device 100 as is illustrated in FIG. 4 likewise in the form of an abstract circuit diagram, the arrangement from FIG. 3 can be used beneficially, namely by parallel superposition of a semiconductor component 10 from FIG. 3, e.g. in the sense of an elementary transistor element T in a cell array or the like, regions that correspond to one another functionally, such as, for example, the source regions S1 to Sn, the drain regions D1 to Dn and also the gate regions G1 to Gn, being assigned to one another and, if appropriate, being electrically contact-connected to one another. In the case of the arrangement shown in FIG. 4, each individual element 10-1 to 10-n, which each intrinsically represent semiconductor components according to the invention, is formed with individual transistors T1 to Tn, with a dedicated NTC thermistor NTC1, . . . , NTCn and with a corresponding gate series resistor RG1, . . . , RGn. The transistor thus formed overall in the sense of a semiconductor device according to the invention is divided into n regions 1 to n or n semiconductor components 10-1 to 10-n in accordance with the present invention with separate gates Gj, j=1, . . . , n. Each of the regions j or each of the semiconductor components 10-j thus has an individual and dedicated control resistor NTC between the respective gate Gj and the common source terminal SA via which all of the source regions Sj are contact-connected to one another. The drain terminal DA is formed jointly for all of the drain regions D1-Dn. The gate series resistors RG1, . . . , RGn are electrically connected to a likewise common gate terminal GA.

Figure 5:
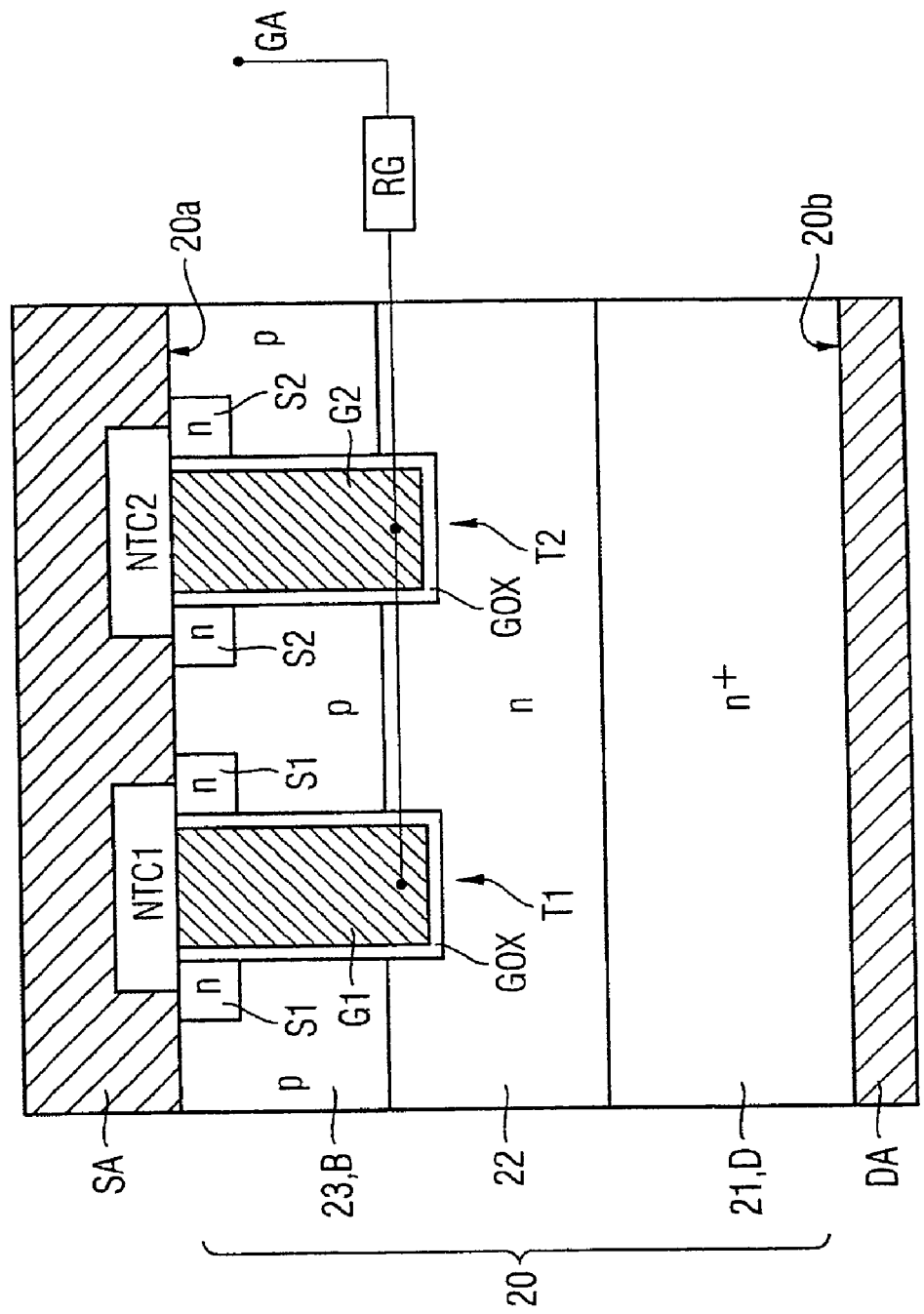
FIG. 5 is a lateral cross-sectional view for a semiconductor component according to the invention.

FIG. 5 is a lateral cross-sectional view illustrating the substrate subdivision or division of a semi-conductor component according to the invention in the sense of a trench-type field effect transistor T. Two trenches are introduced in a semiconductor substrate 20 with individual regions 21, 22, and 23, are lined with a so-called gate oxide GOX and are filled with gate regions G1 and G2 or gate electrodes G1 and G2. The bottommost semiconductor material region 21 forms the drain region D, which is $n^+$-doped in the embodiment of FIG. 5 and forms a common drain region D for two transistors T1 and T2. The topmost semiconductor region 23 is p-doped and essentially forms the body zone B of the transistors T1 and T2. A second semiconductor material region 22 with n-type doping is formed in between. The source regions S1 and S2 with n-type doping are provided at the surface of the topmost semiconductor material region 23. At the surface 20a of the superordinate semiconductor material region 20, a material for the control resistance element NTC is formed, by means of which the gate regions G1 and G2 are respectively electrically contact-connected to the source regions S1 and S2 without the source regions S1 and S2 being contact-connected to the gate regions G1 and G2, respectively, in a direct manner because said gate regions are isolated by the gate oxide GOX in the surface region 20a of the superordinate semiconductor material region 20. The top side 20a and the underside 20b of the arrangement shown in FIG. 5 are adjoined by a common source terminal SA in the sense of a source metallization and by a common drain terminal DA in the sense of a drain metallization. The gates are contact-connected to a gate terminal region GA via a common gate series resistor or control region series resistor RG. The embodiment from FIG. 5 approximately corresponds to the circuitry arrangement from FIG. 3.

Figure 6:
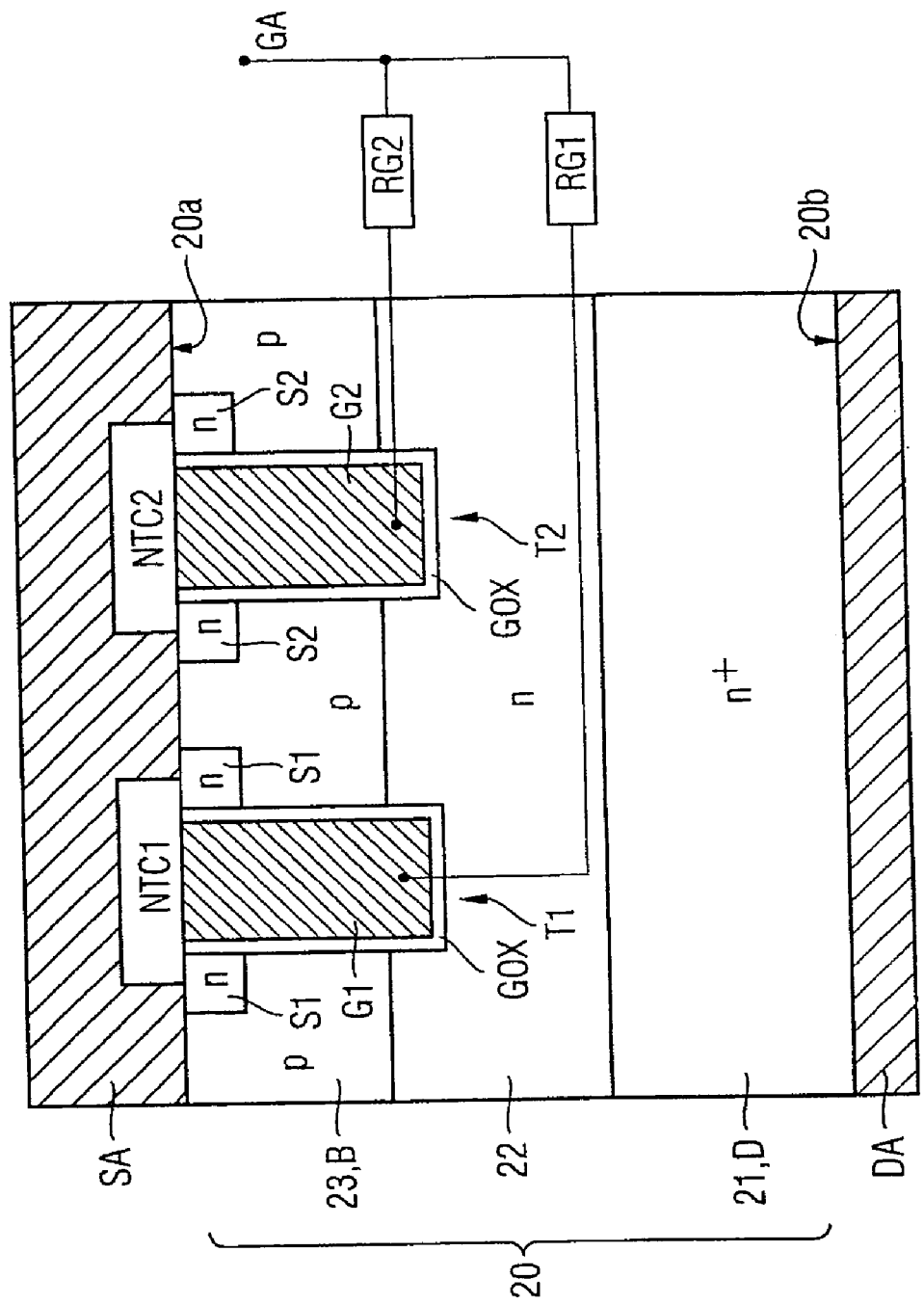
FIG. 6 is a lateral cross-sectional view of another embodiment of the semiconductor component according to the invention.

FIG. 6 likewise shows a lateral cross-sectional view of an arrangement for a semiconductor component according to the invention in the form of a MOSFET transistor. The arrangement essentially corresponds to the arrangement from FIG. 5 but with the difference that, in the case of the embodiment of FIG. 6, each of the gate regions G1 and G2 has an individual gate series resistor RG1 and RG2, respectively, for contact-connection to the gate terminal GA.

LIST OF REFERENCE SYMBOLS

10 Integrated semiconductor component according to the invention
20 Semiconductor material region, superordinate semiconductor material region
20a Top side region, surface region
20b Underside region, rear side region
21 First, bottommost semiconductor material region, in particular for the drain region
22 Second semiconductor material region
23 Third semiconductor material region, topmost semiconductor material region, in particular for the body region
100 Integrated semiconductor device according to the invention
A1, A1j First terminal/terminal region of the control resistance element NTC
A2, A2j Second terminal/terminal region of the control resistance element NTC
D, Dj Second input/output region, drain region, drain
DA, DAj Drain terminal region, drain terminal
G, Gj Control region, gate region, gate
GA, GAj Control terminal region, gate terminal region, gate terminal
j Current through control resistance element NTC
NTC, NTCj Control resistance element, NTC thermistor
R, Rj Nonreactive resistance of the control resistance element
RB Limiting resistor
RG, RGj Control region series resistor, gate series resistor
S, Sj Second input/output region, source region, source
SA, SAj Source terminal region, source terminal
T, Tj individual transistor, elementary transistor, transistor, FET
$V_G$ voltage across control resistance element NTC, gate voltage

The invention claimed is:

1. A semiconductor component, comprising:
   at least a first input/output region;
   at least a second input/output region;
   a control region; and
   a control resistance element in electrical contact with the control region and with the first input/output region, the control resistance element having an operating temperature range in which a nonreactive resistance of the control resistance element decreases as an operating temperature of the control resistance element increases;
   wherein operating properties of the semiconductor component are controllable based on an electrical potential difference between the control region and the first input/output region, and
wherein the control resistance element is constructed as a semiconductor material having a doping concentration of less than approximately $10^{14}$ cm$^{-3}$.

2. The semiconductor component as claimed in claim 1, wherein the control resistance element is configured to sense approximately a thermal state of at least one of the group consisting of the control region, the first input/output region, and the second input/output region.

3. The semiconductor component as claimed in claim 2, wherein the control resistance element is disposed approximately in direct proximity to at least one of the group consisting of the control region, the first input/output region, and the second input/output region.

4. The semiconductor component as claimed in claim 1, wherein the control resistance element comprises an NTC thermistor having a first terminal region and a second terminal region, the first terminal region in electrical contact with the first input/output region of the semiconductor component, and the second terminal region in electrical contact with the control region of the semiconductor component.

5. The semiconductor component as claimed in claim 1, wherein the control resistance element is integrally formed with the control region, the first input/output region, and the second input/output region.

6. The semiconductor component as claimed in claim 1, wherein the first input/output region comprises a source region of a transistor.

7. The semiconductor component as claimed in claim 1, wherein the first input/output region comprises an emitter region of a transistor.

8. The semiconductor component as claimed in claim 1, wherein the second input/output region comprises a drain region of a transistor.

9. The semiconductor component as claimed in claim 1, wherein the second input/output region comprises a collector region of a transistor.

10. The semiconductor component as claimed in claim 1, wherein the control region comprises a base region of a transistor.

11. The semiconductor component as claimed in claim 1, wherein the control region comprises a gate region of a transistor.

12. The semiconductor component as claimed in claim 11, wherein the gate region forms a gate of a gate controlled power semiconductor component.

13. The semiconductor component as claimed in claim 1, wherein the control region comprises a control region of a device that comprises one of is formed as a component from the group consisting of a MOSFET, an IGBT, an EST, a GTO, a MCT, and a bipolar transistor.

14. The semiconductor component as claimed in claim 1, wherein the semiconductor component comprises a monolithically-integrated semiconductor component.

15. The semiconductor component as claimed in claim 1, wherein the control region includes series resistor configured to receive a control signal.

16. The semiconductor component as claimed in claim 15, wherein the series resistor is formed at least in part from polysilicon.

17. The semiconductor component as claimed in claim 16, wherein the series resistor is disposed in at least one trench structure.

18. The semiconductor component as claimed in claim 1, further comprising a trench structure component having at least one trench structure.

19. The semiconductor component as claimed in claim 18, wherein the trench structure component includes the control region.

20. The semiconductor component as claimed in claim 1, wherein the control resistance element comprises an NTC thermistor.

21. The semiconductor component as claimed in claim 1, wherein the control resistance element comprises at least a part of a layer disposed between the control region and the first input/output region.

22. The semiconductor component as claimed in claim 1, further comprising a gate electrode, and wherein:
   the first input/output region comprises a source region; and
   the control resistance element comprises at least a part of a layer disposed between the gate electrode and the source region.

23. The semiconductor component as claimed in claim 1, wherein the control resistance element is constructed at least in part from at least one material selected from the group consisting of: germanium, silicon, titanates, dichromates, amorphous semiconductor materials, and polycrystalline semiconductor materials.

24. The semiconductor component as claimed in claim 1, wherein the control resistance element is configured to have, at a temperature of approximately 400 K, a nonreactive resistance that is approximately at least ten times the nonreactive resistance of the control resistance element at a temperature of approximately 500 K.

25. The semiconductor component as claimed in claim 1, further comprising a limiting resistor electrically connected in series with the control resistance element between the control region and the first input/output region.

26. The semiconductor component as claimed in claim 25, wherein the limiting resistor is electrically connected between the control region and the control resistance element.

27. An integrated semiconductor device comprising at least one semiconductor component, each semiconductor component including:
   at least a first input/output region;
   at least a second input/output region;
   a control region; and
   a control resistance element in electrical contact with the control region and with the first input/output region, the control resistance element having an operating temperature range in which a nonreactive resistance of the control resistance element decreases as an operating temperature of the control resistance element increases;
   wherein operating properties of the semiconductor component are controllable based on an electrical potential difference between the control region and the first input/output region wherein the control resistance is constructed as a semiconductor material having a doping concentration of less than approximately $10^{14}$ cm$^{-3}$.

28. The integrated semiconductor device as claimed in claim 27, wherein the at least one semiconductor component comprises a plurality of semiconductor components connected in parallel in a cell array.

29. The integrated semiconductor device as claimed in claim 28, wherein the cell array is divided or subdivided into a plurality of control regions.

30. The integrated semiconductor device as claimed in claim 27, wherein the control regions of each semiconductor device includes a series resistor, each series resistor connected to one another via a common control terminal.

31. A semiconductor component, comprising:
   at least a first input/output region;
   at least a second input/output region;
   a control region; and
   a control resistance element in electrical contact with the control region and with the first input/output region, the control resistance element having an operating temperature range in which a nonreactive resistance of the control resistance element decreases as an operating temperature of the control resistance element increases;
   wherein operating properties of the semiconductor component are controllable based on an electrical potential difference between the control region and the first input/output region wherein the control resistance element comprises a semiconductor material having a band gap larger than approximately 2 eV.

32. The semiconductor component as claimed in claim 31, further comprising a limiting resistor electrically connected in series with the control resistance element between the control region and the first input/output region.

* * * * *